United States Patent [19]

Mohri et al.

[11] Patent Number: 4,739,263
[45] Date of Patent: Apr. 19, 1988

[54] MAGNETIC SENSOR USING THE EARTH'S MAGNETISM

[75] Inventors: Kaneo Mohri, Fukuoka; Masao Shigeta, Urayasu, both of Japan

[73] Assignee: TDK Corporation, Tokyo, Japan

[21] Appl. No.: 881,110

[22] Filed: Jul. 2, 1986

[30] Foreign Application Priority Data

Jul. 15, 1985 [JP] Japan ................ 60-156586
Jul. 15, 1985 [JP] Japan ................ 60-156587

[51] Int. Cl.$^4$ ............... G01V 33/02; G01C 21/08; G01C 17/30
[52] U.S. Cl. ................ 324/247; 33/361; 33/363 Q; 324/253
[58] Field of Search ........ 324/244, 247, 249, 253–255, 324/207, 208; 33/355 R, 361, 363 R, 363 Q; 340/870.31, 870.32, 870.33

[56] References Cited

U.S. PATENT DOCUMENTS

| | | | |
|---|---|---|---|
| 2,403,347 | 7/1946 | Depp et al. | 324/254 X |
| 2,432,514 | 12/1947 | Depp et al. | 324/247 X |
| 2,684,464 | 7/1954 | Hastings et al. | 324/220 |
| 2,741,853 | 4/1956 | Anderson | 324/247 X |
| 2,815,499 | 12/1957 | Brynes | 324/247 X |
| 2,991,414 | 7/1961 | Tillman | 324/253 |
| 3,133,244 | 5/1964 | Wojtulewicz | 324/247 |
| 3,260,930 | 7/1966 | Kawada | 324/253 |
| 3,445,928 | 5/1969 | Beynon | 324/254 X |
| 3,919,630 | 11/1975 | Oshima et al. | 324/254 X |
| 4,528,481 | 7/1985 | Becker et al. | 324/244 X |
| 4,616,424 | 10/1986 | Arakawa et al. | 33/361 |

FOREIGN PATENT DOCUMENTS 30411 8/1984 Japan.

OTHER PUBLICATIONS

Itoh, Hisatsugu, *Magnetic Field Sensor and Its Application to Automobiles*, Society of Automotive Engineers publication, 1980, No. 800123, pp. 83–90.

*Primary Examiner*—Gerard R. Strecker
*Attorney, Agent, or Firm*—Burgess, Ryan & Wayne

[57] ABSTRACT

A direction sensor includes at least one sensor element including a ring-shaped core formed from at least one flexible wire made of zero-magnetostrictive amorphous magnetic material, two pairs of series connected coils spaced from each other at equal intervals about the core for sensing an external magnetic field, with the core being formed by threading the wires through the coils, the coils being excited by an alternating frequency f, wherein voltages of frequency f are produced across each pair of coils; and a process circuit for providing a differential voltage between the voltages of frequency f produced across each pair of coils.

10 Claims, 4 Drawing Sheets

(a)

(b)

MAGNETIC SENSOR USING THE EARTH'S MAGNETISM

BACKGROUND OF THE INVENTION

The present invention relates to a direction sensor or a flux sensor, and in particular, relates to such a sensor for finding the direction of earth magnetism at a particular point. The sensor may be used for finding not only the direction but also the location of the particular point on the earth.

The present invention is applicable to locate an automobile.

A prior earth magnetism flux sensor has been shown in Japanese utility model publication 30411/84, and in an article entitled "Magnetic Field Sensor and Its Application to Automobies" in page 83–90, Society of Automotive Engineers, Inc, 1980.

A prior earth magnetism flux sensor is shown in FIG. 1. In the figure, the detector DET has an O-ring shaped magnetic core C made of permalloy, on whic an exciting coil $C_D$ is wound. A pair of detections coils $C_x$ and $C_y$ which are perpendicular to each other are also wound on the core C so that the core C is completely included in those coils $C_x$ and $C_y$ as shown in the figure. The exciting coil $C_D$ is wound along the path of the flux in the core C as shown in the figure. The oscillator OSC provides a signal of the frequency f (for instance f=500 Hz –2 kHz) to the exciting coil $C_D$. A signal having a double frequency 2f is induced in the coils $C_x$ and $C_y$ according to the horizontal component of the earth's magnetism. The outputs of those coils $C_x$ and $C_y$ are applied to the respective synchronous detectors SYNC through respective bandpass filters BPF and respective amplifiers AMP. The synchronous detectors SYNC also receive the reference signal of the frequency 2f which is provided by said oscillator OSC through a frequency doubler DOUBLER and phase controller (PHASE CONT). The synchronous detectors SYNC provide a direct (DC) signal, the level of which relates to the amplitude of the double frequency 2f signal of the coils $C_x$ and $C_y$. Those DC signals are applied to DC amplifiers AMP, which provide respective outputs $E_x$ and $E_y$, relating to the direction of the coils $C_x$ and $C_y$.

The level of the outputs $E_x$ and $E_y$ depends upon the horizontal component of the earth's magnetism. When the detector DET rotates in the horizontal plane, the output level E of the signals $E_x$ and $E_y$ changes as shown in FIG. 2, in which the horizontal axis shows the direction ($\theta$), and the vertical axis shows the level E. The curves are sinusoidal as shown in the figure.

However, the device of FIG. 1 has the following disadvantages. First, the detector DET which must have a ring core is too large in size for practical use (For instance, a prior detector has a diameter of 20-30 mm, and a thickness of 5-10 mm). Further, in the manufacturing process of a detector, it takes a long time to wind a coil on a ring shaped core. An automatic winding on a ring shaped core is impossible. A permalloy core is easily broken by vibration and/or shock. Further, the low exciting frequency is unstable, and therefore, the output levels $E_x$ and $E_y$ are subject to drift over a period of time. The use of a high frequency is also impossible when a permalloy core is used.

SUMMARY OF THE INVENTION

It is an object, therefore, of the present invention to overcome the disadvantages and limitations of prior direction sensors by providing a new and improved direction sensor.

It is also an object of the present invention to provide a direction sensor which is small in size, light in weight, simple in manufacturing process, and has high operational reliability without drift.

The above and other objects are attained by a direction sensor having at least one sensor element having an elongated core made of magnetic material; a pair series connected coils wound on said coil with spacing; said coils being excited by alternate frequency f, and a process circuit for providing a differential voltage between voltages of frequency f induced on said coils.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
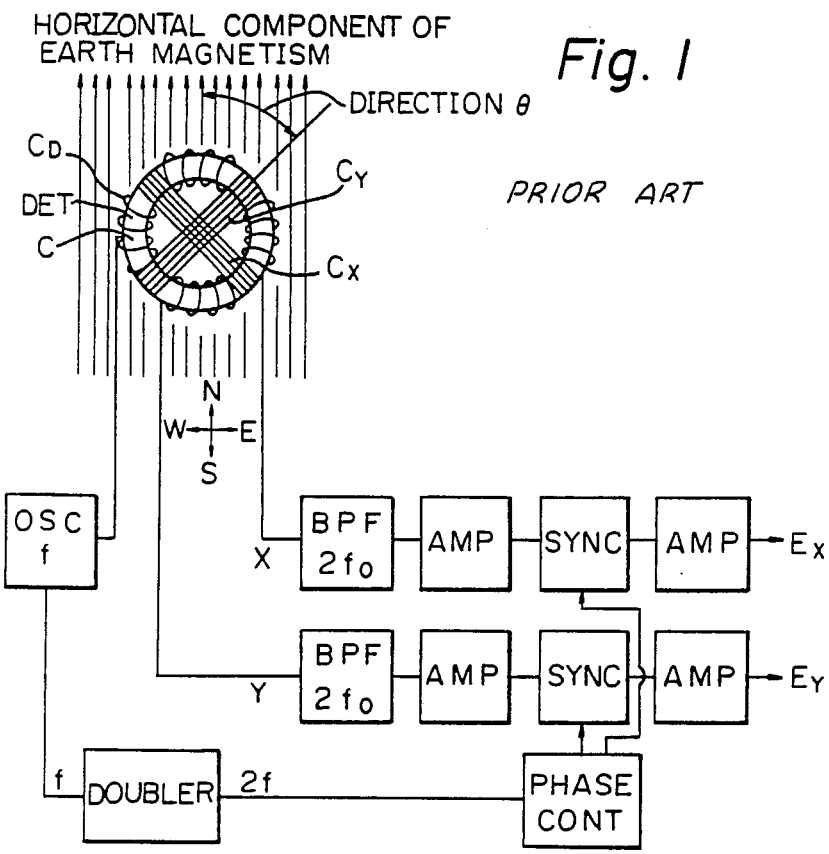
FIG. 1 is a block diagram of a prior direction sensor.
Figure 2:
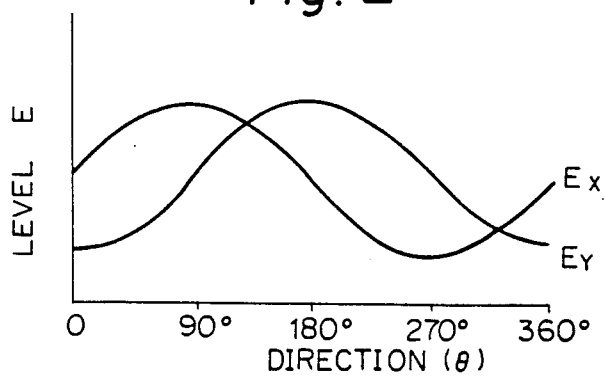
FIG. 2 is a graphical representation showing curves of operation of the apparatus of FIG. 1.
Figure 3:
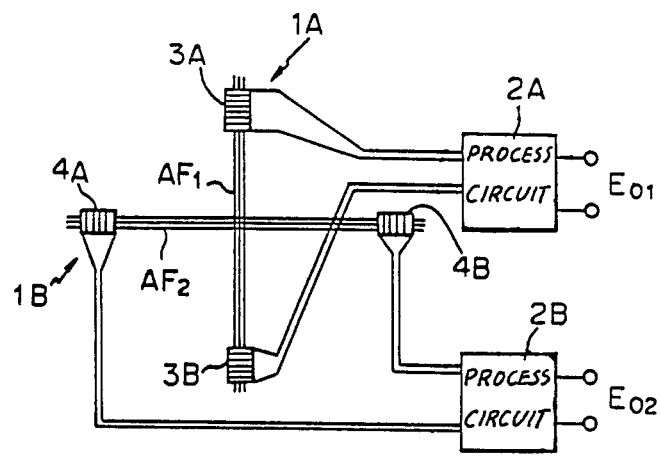
FIG. 3 shows a structure of the direction sensor according to the present invention.

FIG. 3 shows a structure of the direction sensor according to the present invention. The sensor of FIG. 3 has a pair of sensor elements 1A and 1B which are located perpendicular to each other. The angle between the sensors 1A and 1B is not restricted to 90°, but another angle except 0° is possible.

The sensor element 1A has core wires $AF_1$ which are made of magnetic amorphous material with zero-magneto striction. For instance, said sensor element is comprised of three wires each of which is 20 through 30 mm in length, and 110 microns in diameter. An example of the composition of the wires is $Co_{68}Fe_4Si_{13}B_{15}$ (atomic percent). A pair of coils 3A and 3B are wound on the extreme opposite ends of the wires as shown in the figure. The number of turns of each of coils 3A and 3B is 150 through 300 turns. The diameter of the coil on the wires is about 1 mm. The coils 3A and 3b are coupled with the process circuit 2A.

The other sensor element 1B has the same structure as that of 1A, and has wires $AF_2$, a pair of coils 4A and 4B, and a related process circuit 2B.

Figure 4:
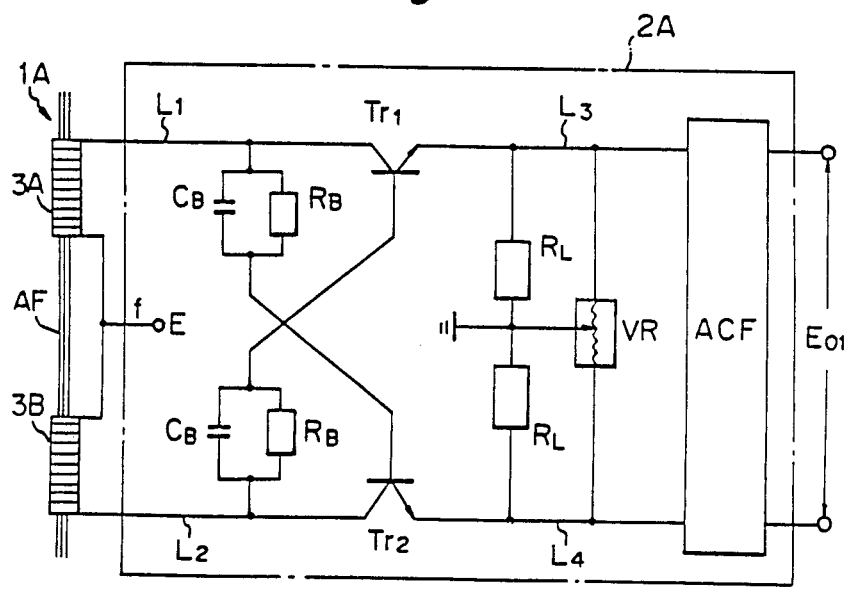
FIG. 4 is a circuit diagram of a process circuit, which is coupled with the device of FIG. 3.

The process circuits 2A and 2B are the same as each other, and one of them is shown in FIG. 4. The structure of the process circuit is essentially an astable multivibrator circuit having a pair of transistors $T_{r1}$ and $T_{r2}$, each base of which is coupled with the collector of the other transistor through a parallel circuit of a capacitor $C_B$ and a resistor $R_B$. The collector of the transistor $T_{r1}$ is connected to one end of the coil 3A through the line $L_1$, and the collector of the transistor $T_{r2}$ is connected to one end of the coil 3B through the line $L_2$. The emitters of the transistors $T_{r1}$ and $T_{r2}$ are coupled with an active filter ACF which is a lowpass filter through the lines $L_3$ and $L_4$, respectively. Those emitters are bridged by a series circuit of a pair of load resistors $R_L$, and a variable resistor VR. The junction point of said load resistors $R_L$, and the variable terminal of the variable resistor VR is ground. The variable resistor VR adjusts the balanced condition of the circuit so that no output signal $E_{01}$ is provided when no flux is applied to the device. The output of the active filter ACF is the output $E_{01}$ of the sensor element. The coils 3A and 3B are connected in series so that the differential output of the coils is provided to the lines $L_1$ and $L_2$. The junction point of the coils is coupled with the power source E, which supplies the frequency f. The frequency f is in the range between 100 kHz and 500 kHz, and is preferably 200 kHz.

The higher the frequency f is, the more preferable it is to induce a higher voltage to a process circuit. The upper limit of the frequency f is determined by the operational characteristics of the amorphous material.

When the coils 3A and 3B which are located at the opposite ends of the magnetic wires AF are excited by the signal of the frequency f, the output level $E_{01}$ is zero if no bias flux is applied to the magnetic wire $AF_1$. On the other hand, when the wire $AF_1$ is magnetically biased by the earth's magnetism, the output of the coil 3A increases, and the output of the other coil 3B decreases. Therefore, the differential level between the lines $L_1$ and $L_2$ is not zero, but has some level except zero relating to the bias flux. Thus, the balance condition of the circuit is broken by the bias flux, and therefore, the output level $E_{01}$ has some amplitude relating to the bias flux, or the earth's magnetism.

The structure and the operation of the other sensor element 1B are the same as those of element 1A, and the second sensor element 1B provides the output $E_{02}$ relating to the bias flux, or the earth's magnetism on the core $AF_2$.

Figure 5:
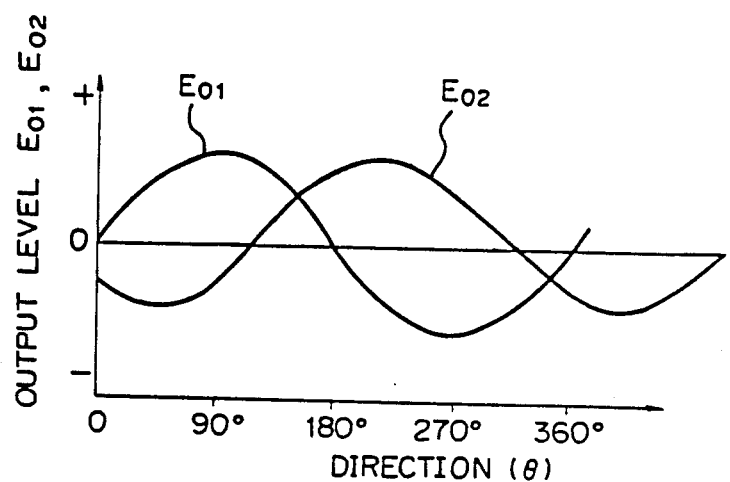
FIG. 5 shows curves of operation of the direction sensor of FIGS. 3 and 4.

When the sensor element 1A or 1B is positioned on a horizontal plane with some angle to the earth's magnetism, the output level $E_{01}$ or $E_{02}$ depends upon that angle, and the level $E_{01}$ and/or $E_{02}$ is on the sinusoidal curve as shown in FIG. 5, in which the horizontal axis shows the direction ($\theta$), and the vertical axis shows the output level.

It should be appreciated that a single sensor element is not sufficient to provide the absolute value of the direction, because each output level $E_{01}$ or $E_{02}$ corresponds generally to two directions in 0°–360°. A combination of a pair of sensor elements with some angle may provide the absolute single direction. That angle is not restricted to 90°, but any angle except 0° is available.

The output signals $E_{01}$ and $E_{02}$ are applied to an external circuit (not shown), which indicates the absolute value of the direction.

It should be appreciated that the present sensor elements 1A and 1B must be located on the horizontal plane for accurate measurement of the earth's magnetism. In order to detect the horizontal condition, a third sensor element which is the same as that of FIGS. 3 and 4 may be used. The third sensor element is located vertically, and the vertical condition is detected when the output of the third sensor element is zero.

Therefore, by combining the third vertical sensor element with a pair of horizontal sensor elements of FIG. 3, the horizontal sensor elements can be located on horizontal plane, and the accurate measurement of the earth's magnetism is carried out.

Figure 6:
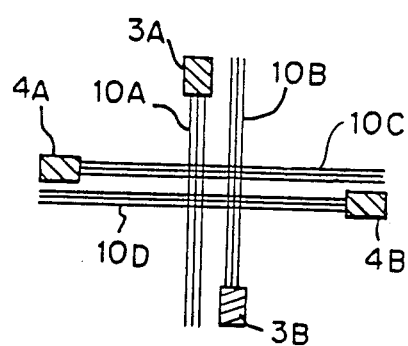
FIG. 6 is a structure of the modification of the direction sensor of FIG. 3.

FIG. 6 shows a modification of the sensor element. In this modification, a pair of amorphous wire bundles 10A and 10B are located parallel to each other. And, a coil 3A is provided at the extreme end of the wire bundle 10A, and another coil 3B is provided on the extreme end of the wire bundle 10b so that the coils 3A and 3B are positioned at opposite ends of each wire. Similarly, a second sensor element is comprised of a pair of amorphous wire bundles 10C and 10D positioned parallel to each other, and the coils 4A and 4B positioned at the extreme ends of the wire bundles so that the coils locate at opposite ends of the wires. The parallel wire bundles 10A and 10B (10C and 10D) are positioned very close to each other. The structure of FIG. 6 is magnetically equivalent to the structure of FIG. 3. The structure of FIG. 6 is used when it is convenient for manufacturing reasons, and/or mounting reasons of the elements.

Figure 7:
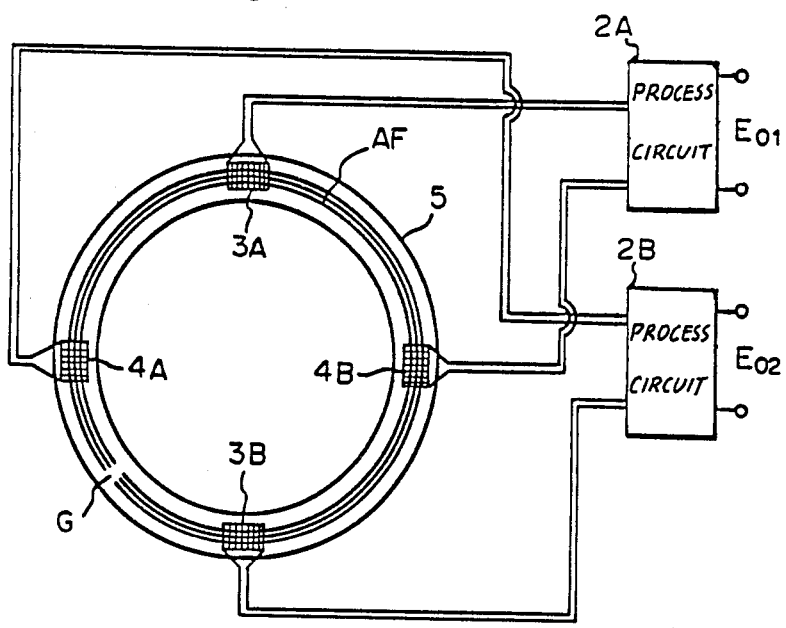
FIG. 7 shows a structure of another embodiment of the direction sensor according to the present invention.

FIG. 7 shows an other embodiment of the sensor element according to the present invention. In the figure, the sensor element has a hollow tube 5 made of non-magnetic material, like a plastic. An amorphous core AF with three wires in a circular ring shape, having four coils 3A, 3B, 4A and 4B are located in said tube 5. Preferably, the amorphous core AF is C-shaped so that a gap space G is provided between extreme ends of the core AF. In the preferred embodiment, the diameter of each wire of the core is 110 microns, the number of wires is three, the composition of the amorphous material is $Co_{68}Fe_4Si_{13}B_{15}$ in atomic percent, and the wire is made of zero-magneto striction amorphous material. The coils 3A and 3B are located on the diameter of the ring, and the coils 4A and 4b are located at another diameter of the ring. The length of the gap space G determines the de-magnetizing effect, and said length is designed according to the range of the magnetic field to be measured, and the sensitivity of the sensor. The longer the gap G is, the lower the sensitivity of the device is, and the wider the operational dynamic range is.

The sensor element is coupled with the process circuits 2A and 2B, which provide the output signals $E_{01}$ and $E_{02}$, as in the case of the embodiment of FIGS. 3 and 4.

Figure 8:
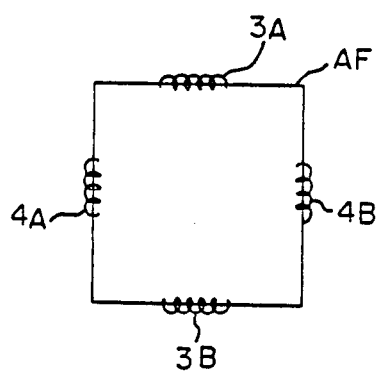
FIG. 8 shows some modifications of the direction sensor of FIG. 7.
Figure 8:
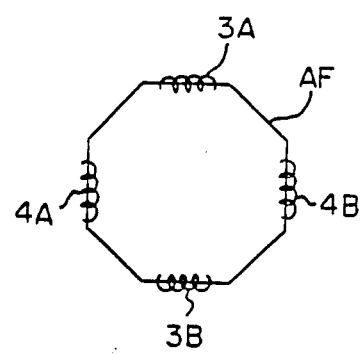

FIG. 8 shows modifications of the embodiment of FIG. 7. The modification of FIG. 8A has the feature that the core AF is in a rectangular shape instead of a circular ring shape, and the feature of FIG. 8B is that the core AF is in an octagonal shape. Generally, a polygonal core instead of a circular core is possible in the present invention. a polygonal core has the advantage as compared with a circular core that it has a linear portion which is convenient to mount a coil. Of course, a gap space G is provided in the modification of FIG. 8, although it is not shown for the sake of the simplicity of the drawing.

It should be appreciated of course that a core may be comprised of a single amorphous wire, although the embodiments show a core with three wires.

Finally, some specific advantages of the present invention are enumerated.

(a) As the output voltage of a sensor element is a voltage of frequency f induced on the coil, the higher the operational frequency is, the higher the output voltage is. Therefore, the use of high frequency is possible. The upper limit of the operational frequency is about 500 kHz, which is restricted by the characteristics of the amorphous material. Due to the use of higher frequency than the prior art, the operation is stale, and the drift of the output signal over a long period of time is small, as compared with those of the prior art.

(b) The sensor element is not affected by vibration, and/or shock, because of the use of zero-magneto striction amorphous material, which has no anisotropy.

(c) The winding process of a coil on a wire is simple, as compared with the winding process on a ring in the prior art. Therefore, the manufacturing process is simplified, and the manufacturing cost is reduced, as compared with the prior art.

From the foregoing it will now be apparent that a new and improved flux sensor or a direction sensor has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A direction sensor comprising:
at least one sensor element including a ring-shaped core formed from at least one flexible wire made of zero-magnetostrictive amorphous magnetic material, two pairs of series connected coils spaced from each other at equal intervals about said core for sensing an external magnetic field, said core being formed by threading said at least one wire through said coils, said coils being excited by an alternating frequency f, wherein voltages of frequency f are produced across each said pair of coils; and
a process circuit for providing a differential voltage between said voltages of frequency f produced across each said pair of coils.

2. A direction sensor according to claim 1, wherein said core is formed by a coil having a bundle of wires.

3. A direction sensor according to claim 2, wherein said core has a magnetic gap.

4. A direction sensor according to claim 2, wherein said core is continuous with no magnetic gap.

5. A direction sensor according to claim 1, wherein said core has a circular shape.

6. A direction sensor according to claim 1, wherein said core has a polygonal shape.

7. A direction sensor according to claim 1, wherein said process circuit comprises a pair of transistors; a pair of parallel circuits of a capacitor and a resistor coupled between a base of one transistor and a collector of the other transistor, the collector of of each transistor being coupled with an end of each coil, a junction point of the series connected coils being coupled with a power supply of frequency f, a balance circuit bridging emitters of said transistors, and a lowpass filter coupled across said emitters to provide an output direction signal.

8. A direction sensor according to claim 3, wherein said frequency is between 100 kHz and 500 kHz.

9. A direction sensor according to claim 1, wherein the length of each said wire is in a range between 20 mm and 30 mm, the diameter of each said wire is 110 microns, the composition of said core is $Co_{68}Fe_4Si_{13}B_{15}$ in atomic percent, and the number of turns of each coil is in a range between 150 turns and 300 turns.

10. A direction sensor according to claim 1, wherein said core and coils are mounted in a hollow tube.

* * * * *